United States Patent

[11] 3,628,048

[72] Inventors James S. Lee; John L. Engel, both of Santa Barbara, Calif.
[21] Appl. No. 434
[22] Filed Jan. 2, 1970
[45] Patented Dec. 14, 1971
[73] Assignee Santa Barbara Research Center Goleta, Calif.
Continuation of application Ser. No. 627,901, Apr. 3, 1967. This application Jan. 2, 1970, Ser. No. 434

[54] HIGH CURRENT PULSING ARRANGEMENT TO ENERGIZE COHERENT RADIATION SOURCE
10 Claims, 5 Drawing Figs.

[52] U.S. Cl. .......... 307/246, 307/252 H, 307/310, 307/312, 328/67
[51] Int. Cl. .......... H03k 17/00
[50] Field of Search .......... 307/311, 312, 246, 252, 310; 328/67; 315/241 D, 241 S; 250/194; 331/94.5

[56] References Cited

UNITED STATES PATENTS

| | | | |
|---|---|---|---|
| 3,025,417 | 3/1962 | Campbell | 307/288 |
| 3,176,158 | 3/1965 | Guignard | 328/67 |
| 3,473,049 | 10/1969 | Alexander | 328/67 |
| 3,486,043 | 12/1969 | Johannessen | 328/67 |

*Primary Examiner*—Donald D. Forrer
*Assistant Examiner*—David M. Carter
*Attorneys*—W. H. MacAllister, Jr. and Bernard P. Dracklis

ABSTRACT: A low-impedance radiation-emitting diode is provided to emit pulses of coherent radiation in response to the application of high energy pulses. The circuit includes an oscillator which triggers a single shot multivibrator, the latter rendering a switching transistor conductive to provide a path through an inductor to ground. Current builds up linearly in the inductor and at termination of the pulse provided by the single shot, the switching transistor assumes a nonconductive state. The inductor is subsequently discharged through a storage capacitor which is appropriately discharged through the radiation-emitting diode thereby producing the emission of a pulse of coherent radiation.

INVENTORS
JAMES S. LEE,
JOHN L. ENGEL,
BY
Neil J. Driscoll
ATTORNEY

HIGH CURRENT PULSING ARRANGEMENT TO ENERGIZE COHERENT RADIATION SOURCE

This is a continuation of application Sec. No. 627,901 filed Apr. 3, 1967.

The invention relates to an arrangement to provide a high electrical current pulse and the delivering of said pulse to a low impedance load, for example, a load to be pumped and emit pulsed coherent radiation in a desired band of the energy spectrum.

Certain recently developed service applications require high electrical current periodically pulsed to a load to induce the load to lase, that is, emit bursts or pulses of coherent radiation. One such service application utilizes a low-impedance light-emitting diode to create short pulses of coherent infrared radiation when properly pumped with the mentioned current. Utility for such an arrangement has been found in invisible alarm systems and the like used to provide continued intrusion surveillance over a given geographical area. The present invention forms an important segment of such a system and is advantageous in that it is highly portable and may be used for area surveillance in geographical locations which involve rough terrain in the absence of conventional power sources. The particular invention herein disclosed delivers high current pulses to a low-impedance radiation-emitting load in a highly efficient manner thereby providing long system life. The efficiency of the arrangement has particular utility in those applications where the source of electrical current is a portable battery or the like. Energy use per unit of time is minimized and effective battery life and system life lengthened.

Characteristically, prior art high current pulsers utilize a supply voltage in series arrangement with a resistance and a capacitor coupled to ground. The capacitor is charged by the supply voltage during a given segment of its cyclic operation until the capacitor is fully charged whereupon the arrangement, under the control of an appropriate oscillator or the like, completes the circuit allowing the capacitor to discharge its energy to the load. A particular disadvantage of this arrangement is that a minimum of 50 percent of the energy delivered by the supply voltage is lost in the series resistance through which the current flows. Patently, such a pulsing arrangement is not conducive to long-life efficient field operation and maximum utilization of the energy source.

The present invention provides a unique resonant charging circuit operatively arranged with a supply voltage which allows current in an inductive load to increase linearly during a determined period of time and appropriate switching control associated with the inductive load and a capacitor whereby the energy stored is transferred to the capacitor during a short segment of the operating cycle. The invention also incorporates a load switching control whereby the energy stored in the capacitor may be discharged to load, thus energy pumping the load and thus creating short pulses of coherent radiation. A particular advantage of the disclosed arrangement, in addition to the simplicity thereof, is that energy loss is minimized with consequent high efficiency and long service life for the system and its energy source such as a battery.

These and other advantages and features of the invention will become apparent in the course of the following description and from an examination of the related drawings wherein.

Figure 1:
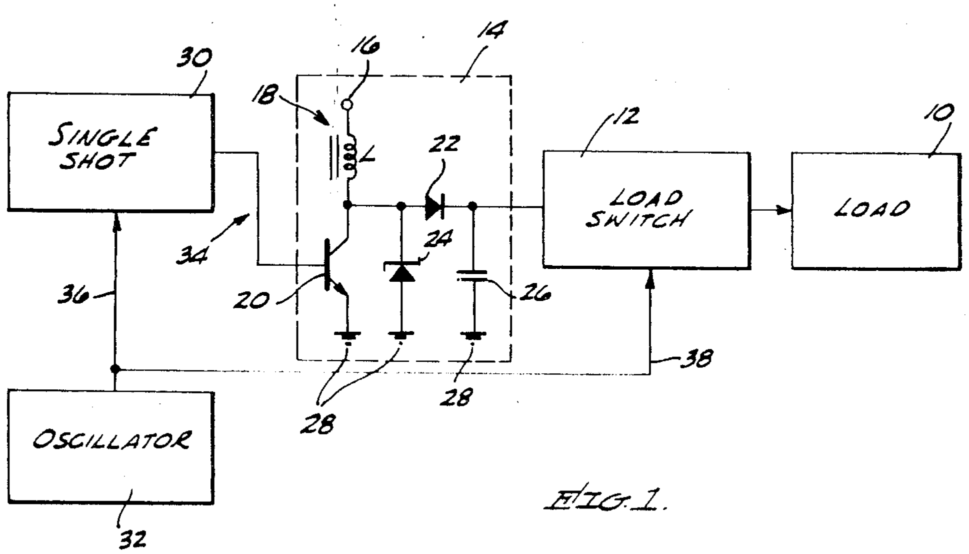
FIG. 1 is a block diagram of a partial arrangement associated with a low-impedance coherent radiation-producing load and embodying the recited features of the invention.

Describing the invention in detail and directing attention to FIG. 1, the numeral 10 generally indicates a typical low-impedance load, such as a gallium arsenide diode having the capacity, when properly pumped by an appropriate electrical current, to emit energy in the form of coherent radiation. Typically, the diode or load 10 will emit such coherent radiation in the infrared band of the energy spectrum. Because the radiation is invisible, it has demonstrated utility in intrusion alarm signalling devices and the like.

Controlling the application of current to the load 10 is a load switch 12 which is normally open preventing the application of current to the load 10. A resonant charging circuit is indicated in the block diagram generally at 14 and comprises an inductive load 18 coupled in series with a terminal 16, to which an appropriate biasing voltage is applied.

The balance of the resonant charging circuit 14 comprises a transistor 20, which serves a switching function, a diode 22 coupled between the collector terminal of transistor 20 and the load switch 12, a Zener diode 24 coupled by the anode of the diode 22 and ground potential and a capacitor 26 coupled by the cathode of the diode 22 and ground potential.

A single shot multivibrator indicated generally at 30 is provided and comprises a source of time-pulsed voltage responsive to the control exercised by a unijunction oscillator 32. The single shot 30 drives the switching transistor 20 via line 34. The oscillator 32 is electrically coupled by a lead 36, to the single shot 30 and by a lead 38 to a load switch 12.

In operation, pulses from the oscillator 32 serve to cause the single shot 30 to apply a pulse of predetermined amplitude and duration to the base of the switching transistor 20. This pulse biases the switching transistor 20 to a conductive state allowing current flow from the source 16 through the inductor 18 to ground 28. Current in the inductor 18 is thus increased. This increase in inductor current is essentially linear provided the time constant of the charging circuit 14 is long as compared to the duration of the pulses from the single shot 30. At the termination of the voltage pulse from the single shot 30, the switching transistor 20 reassumes a nonconductive state and the energy in the inductor 18 is applied through the diode 22 to the capacitor 26 thereby charging the capacitor 26. A Zener diode 24 shunting the capacitor 26 is provided for the purpose of protecting the capacitor 26 and the switching transistor 20 from damage caused by excessively high voltages.

The next pulse provided by the oscillator 32 again triggers the single shot 30 and at the same time closes the load switch 12 which allows the capacitor 26 to immediately discharge its stored energy through the load 10. Concurrently, the pulse provided by the single shot 30 renders the switching transistor 20 conductive, thereby allowing the current in inductor 18 to increase as earlier explained.

Figure 2:
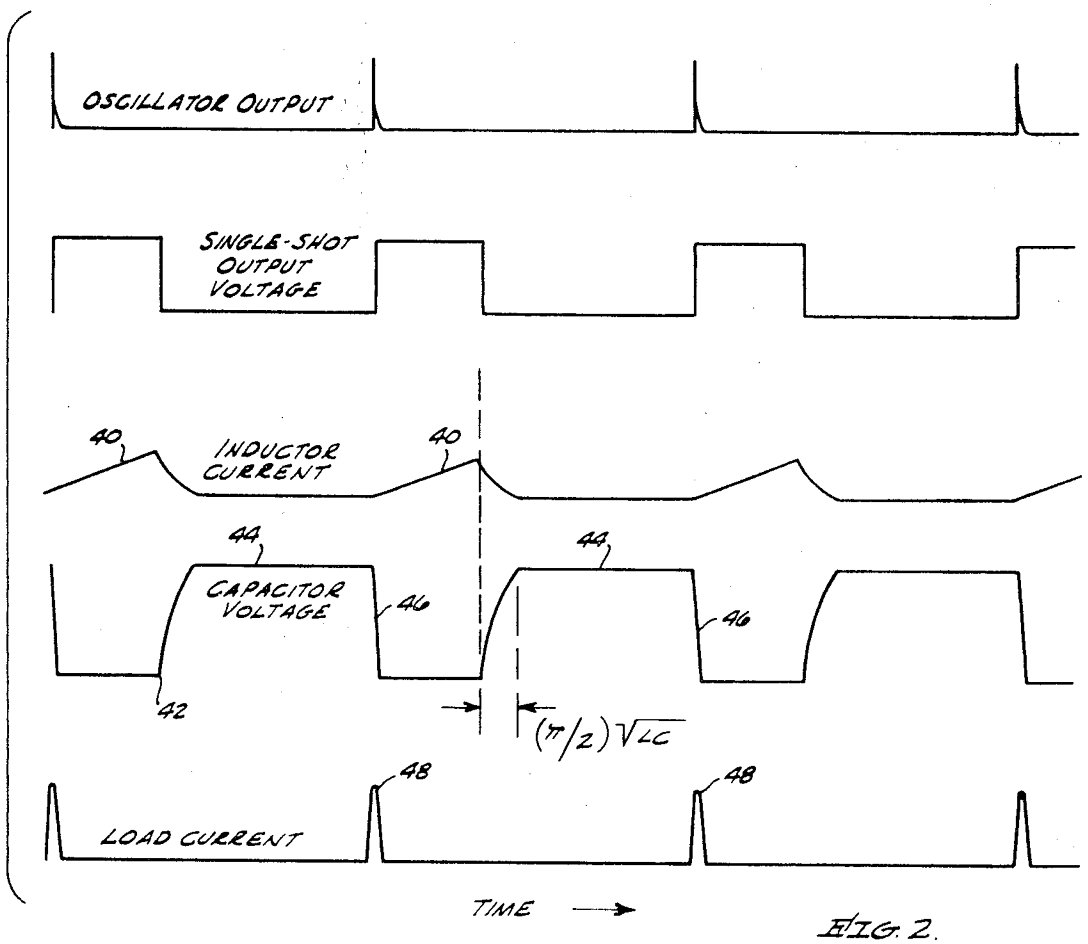
FIG. 2 is a composite view graphically illustrating the mode of operation of the invention.

The operation of the arrangement of FIG. 1 is graphically illustrated in composite FIG. 2. Referring to waveform (a), it will be seen that the output signal of the oscillator 32 is a train of pulses having an appropriate uniform spacing between the pulses.

As earlier explained the oscillator output pulses serve to trigger the single shot 30 which, as a result, generates an output pulse of predetermined amplitude and duration as shown by waveform (b). This single shot output pulse serves to maintain the switching transistor 20 in a conductive state for the duration of the pulse.

Waveform (c) of FIG. 2 illustrates the relationship of inductor current to time. It should be noted, as indicated by the waveform segment indicated at 40, that the current in the inductor rises linearly with time for the duration of the single shot output pulse. Upon the switching transistor 20 becoming nonconductive, the inductor current is applied to the capacitor 26 through the diode 22. The capacitor voltage is illustrated by waveform (d) and increases from a zero level (42) to a maximum (44) when the capacitor is fully charged during a fractional part of the cycle. The capacitor retains the stored energy until the oscillator output pulses again, which, as described above, triggers the single shot and concurrently closes load switch 12 allowing the capacitor to completely discharge through the load 10 as shown by line 46 in waveform (d). Thus, the load receives pulses of current as illustrated by waveform (e). A unique feature of the disclosed invention is that a low impedance coherent radiation-producing diode (load 10) is periodically pumped by a highly efficient energy source thereby assuring minimum energy loss and long operating life.

Figure 3:
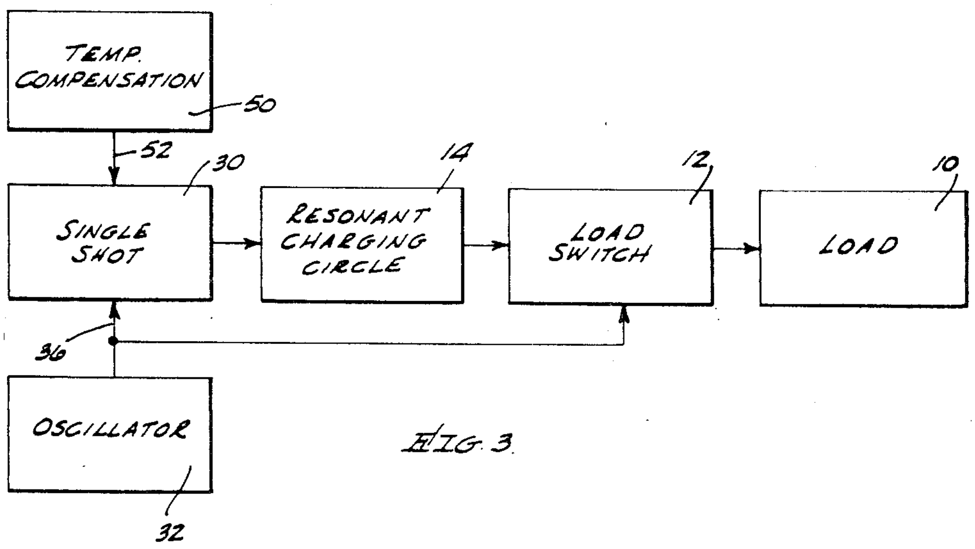
FIG. 3 is a block diagram of an alternate embodiment of the invention which provides responsive control due to variation in ambient temperature condition.

It is well known that a coherent radiation-producing diode, such as the gallium arsenide diode mentioned hereinabove, is importantly affected by ambient temperature; that is, as the ambient temperature increases, more energy is required to pump the diode and induce the production of the coherent radiation. The block diagram of FIG. 3 incorporates a temperature-responsive feature which increases the time duration of the pulse from the single shot 30 in response to a rise in ambient temperature, thus building up a higher average level of current in the inductor 18 and thereby increasing the energy available to pump the load 10. In view of the similarity between the block diagram of FIG. 3 and that of FIG. 1, identical numerals indicate identical parts. Included in the block diagram of FIG. 3 is a temperature-compensating device indicated generally at 50, and connected to single shot 30 by a lead 52. An appropriate temperature-compensating device 50 would be a conventional thermistor as will hereafter be described. The operation of the circuit shown in FIG. 3 is identical to the circuit illustrated by FIG. 1 with the exception that the temperature compensator 50 increases the duration or width of the pulses provided by the single shot 30 in response to increases in the ambient temperature of the load 10. The result is that the linear current build-up in the inductor 18 is increased and more current is applied to the capacitor 26 upon the switching transistor 20 being rendered nonconductive. In all other respects the circuit of FIG. 3 functions identically with that of FIG. 1.

Figure 4:
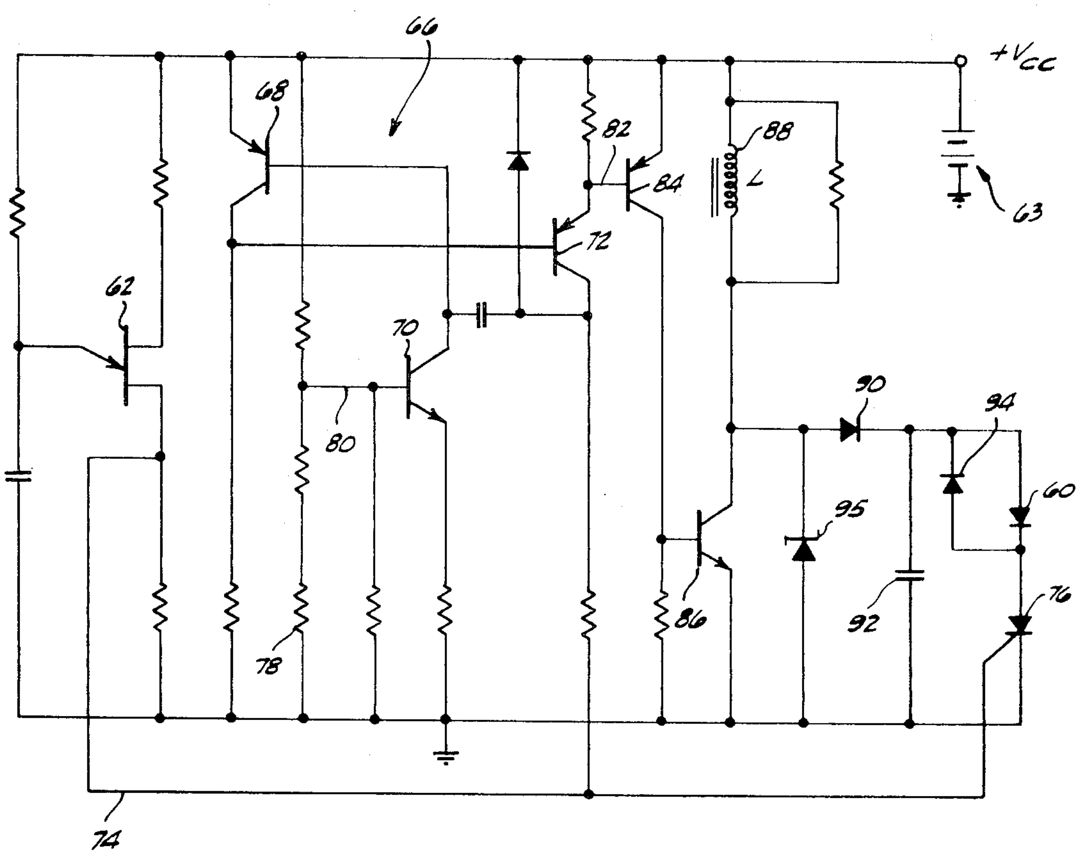
FIG. 4 is a schematic diagram of a typical circuit employing the invention including mode of temperature compensation.

Attention is directed to FIG. 4, which illustrates a schematic circuit of a typical pulsing arrangement to intermittently pump and produce sequential pulses of coherent infrared radiation.

The numeral 60 indicates a solid-state light-emitting diode capable of producing the desired pulse radiation. Control for the entire circuit is provided by an oscillator which utilizes a unijunction transistor 62. The pulsed output of the transistor 62 serves to trigger a single shot arrangement indicated generally at 66 and comprising transistors 68, 70 and 72. A lead 74 connects the unijunction transistor 62 to a silicon-controlled rectifier 76 which provides, when conductive, a path to ground for the lasing diode 60.

Transistor 70 provides a current source whose collector current determines the width of the pulse generated by the single shot 66. Resistor 78 is preferably a thermistor whose resistive characteristic is responsive to ambient temperature conditions. Thus, the thermistor 78, being connected via lead 80 to the base of transistor 70, controls the collector current in transistor 70 by control of the voltage at the transistor base. This voltage varies in response to the ambient temperature level (due to the resistance variation of thermistor 78), and, therefore, controls the width of the pulse generated by single shot 66.

The output of the single shot 66 is applied through the lead 82 to the base terminal of the transistor 84, the output of which serves to render a switching transistor 86 conductive. The inductive load 88 is connected to the primary voltage source 63 and has a path to ground through the switching transistor 86 when it is conductive. Upon pulse initiation by the single shot 66, the current in the inductor 88 increases linearly, the total increase in current depending upon the width of the pulse from single shot 66. At termination of the pulse from single shot 66, switching transistor 86 becomes nonconductive and the energy stored in inductor 88 is transferred through diode 90 to the capacitor 92 and there stored. Also, a small amount of energy is concurrently delivered from the battery to the capacitor 92. At pulse initiation by the oscillator, i.e., unijunction transistor 62, a trigger pulse is applied via line 74 to the gate of the silicon-controlled rectifier 76 which provides a discharge path through laser diode 60 for the energy stored in capacitor 92. Upon turn-on of the silicon-controlled rectifier 76, therefore, the diode 60 is pumped and a pulse of coherent radiation is emitted. A diode 94 is provided in parallel with the lasing diode 60 to protect the lasing diode 60 from reverse voltage transients. Zener diode 95 provides over voltage protection for transistor 86 and capacitor 92.

Figure 5:
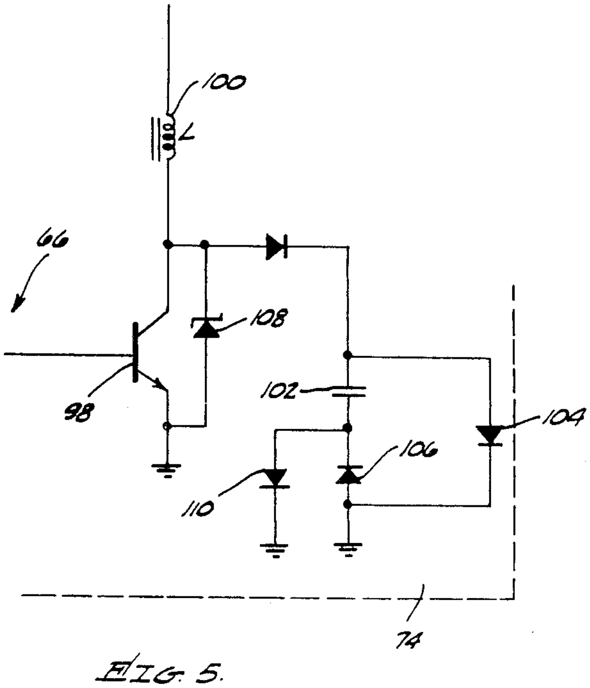
FIG. 5 is a fragmentary schematic circuit diagram illustrating a slight modification of the arrangement shown in FIG. 4.

The schematic view of FIG. 5 is a fragmentary modification of the schematic circuit diagram shown in FIG. 4, the purpose of which is to allow connecting the anode of the laser diode 106 to ground to facilitate heat sinking of the diode. The switching transistor is here indicated at 98 and the inductor at 100. Upon the transistor 98 becoming nonconductive, at the termination of the pulse from the single shot 66 (not shown), the energy stored in the inductor is transferred to the capacitor 102 which is coupled in series with a radiation-emitting diode 106. The capacitor 102 and the diode 106 are shunted by a silicon-controlled rectifier 104. After energy is stored in the capacitor 102, the oscillator, embodied by unijunction transistor 62, applies a pulse to the silicon-controlled rectifier 104 over the lead 74 closing the circuit to ground and accommodating discharge of the energy in capacitor 102 to the lasing diode 106 with consequent emission of radiation. Again, the Zener diode 108 is provided and offers voltage protection for the transistor 98 and the capacitor 102. The diode 110 provides a charging path for the capacitor 102 and prevents the diode 106 from being reverse biased during the time the capacitor 102 is being charged.

It will thus be apparent that a highly efficient circuit arrangement is provided to operate as a power source to periodically pump a low-impedance radiation-emitting diode and to create therefrom short pulses of coherent radiation. The arrangement has the advantage of high efficiency and high portability and is particularly useful as a radiation source in surveillance systems where electrical power must be portably carried with the system and provided by batteries or the like. The losses characteristic of prior art circuits are avoided with consequent long-term reliable system operation.

The arrangement as shown is by way of illustration and may be modified in many particulars all within the scope of the appended claims.

What is claimed is:

1. A triggering arrangement for periodically energizing a load device, said triggering arrangement comprising:

a source of voltage;

a resonant charging circuit, operatively coupled to said source of voltage, for generating pulses of current;

oscillator means, for providing a train of timing pulses;

control means responsive to said timing pulses for regulating the generation of pulses of current by said resonant charging circuit; and gating means, responsive to said timing pulses, for enabling said pulses of current to be applied to said load device.

2. The apparatus defined by claim 1 wherein said gating means includes a silicon controlled rectifier.

3. The apparatus defined by claim 1 wherein said control means comprises a monostable multivibrator having a stable state and an unstable state which is assumed and maintained for a predetermined time duration in response to the application of each of said timing pulses.

4. The apparatus defined by claim 3 further comprising temperature compensating means, operatively coupled to said control means, for controlling the time duration of said unstable state in accordance with ambient temperature conditions.

5. A triggering arrangement for periodically energizing a load device, said triggering arrangement comprising:

a source of voltage;

an inductor coupled to said source of voltage;

switching means, serially connected to said inductor, for controllably coupling said inductor to a lead maintained at ground potential;

a capacitor operatively coupled in parallel with said switching means and said load device for generating pulses of current;

control means for regulating the generation of said pulses of current;

oscillator means, operatively coupled to said control means, for providing a train of timing pulses; and gating means, responsive to said timing pulses, for enabling said pulses of current to be applied to said load device.

6. A triggering arrangement for periodically energizing a load device, said triggering arrangement comprising:

a source of voltage;

an inductor coupled to said source of voltage;

switching means, serially connected to said inductor, for controllably coupling said inductor to a lead maintained at ground potential;

a capacitor operatively coupled in parallel with said switching means and in series with said load device for generating pulses of current;

control means for regulating the generation of said pulses of current;

oscillator means, operatively coupled to said control means, for providing a train of timing pulses; and gating means, responsive to said timing pulses, for enabling said pulses of current to be applied to said load device.

7. The apparatus defined by claim 5 wherein said gating means comprises a silicon controlled rectifier coupled in series with said load device, said serially coupled silicon controlled rectifier and said load device being coupled in parallel with said capacitor.

8. The apparatus defined by claim 6 wherein said gating means comprises a silicon controlled rectifier coupled in parallel with said serially connected capacitor and load device.

9. The apparatus defined by claim 8 wherein said control means comprises a monostable multivibrator having a stable state and an unstable state which is assumed and maintained for a predetermined time duration in response to the application of each of said timing pulses.

10. The apparatus defined by claim 9 further comprising temperature compensating means, operatively coupled to said control means, for controlling the time duration of said unstable state in accordance with ambient temperature conditions wherein said load device is a diode adapted to emit electromagnetic radiation when said diode is energized.

* * * * *